United States Patent [19]

Naito

[11] Patent Number: 5,334,860
[45] Date of Patent: Aug. 2, 1994

[54] PANEL HAVING THIN FILM ELEMENT FORMED THEREON

[75] Inventor: Hideo Naito, Tokyo, Japan

[73] Assignee: Casio Computer Co., Ltd., Tokyo, Japan

[21] Appl. No.: 902,969

[22] Filed: Jun. 23, 1992

[30] Foreign Application Priority Data

Jun. 27, 1991 [JP] Japan ................................. 3-181625

[51] Int. Cl.$^5$ ........................................... H01L 27/01
[52] U.S. Cl. ...................................... 257/59; 257/60; 257/927; 359/87
[58] Field of Search .................. 257/59, 60, 758, 927; 359/87

[56] References Cited

U.S. PATENT DOCUMENTS

| | | | |
|---|---|---|---|
| 4,720,736 | 1/1988 | Takafuji et al. | 257/60 |
| 4,804,953 | 2/1989 | Castleberry | 257/59 |
| 4,894,690 | 1/1990 | Okabe et al. | 257/59 |
| 5,086,347 | 2/1992 | Ukai et al. | 359/87 |
| 5,132,745 | 7/1992 | Kwasnick et al. | 257/57 |
| 5,153,754 | 10/1992 | Whetten | 359/87 |
| 5,168,072 | 12/1992 | Moslehi | 257/327 |
| 5,177,577 | 1/1993 | Taniguichi et al. | 257/59 |

FOREIGN PATENT DOCUMENTS 0209113 1/1987 European Pat. Off.
0407168A2 1/1991 European Pat. Off.

OTHER PUBLICATIONS

Patent Abstracts of Japan, vol. 10, No. 379 (E-465), Dec. 1986 JP-A-61 172 370 (Fujitsu).

*Primary Examiner*—Jerome Jackson
*Assistant Examiner*—Courtney A. Bowers
*Attorney, Agent, or Firm*—Frishauf, Holtz, Goodman & Woodward

[57] ABSTRACT

An insulating substrate has thin film transistors, and scanning and data wires for supplying signals to the transistors. Each of the wires has a two-layered structure comprising a lower metal film and an upper metal film. Oxide films serving as etching stopper films and having a width smaller than each of the lower and upper metal films are interposed between the lower and upper metal films over the entire length thereof.

20 Claims, 8 Drawing Sheets

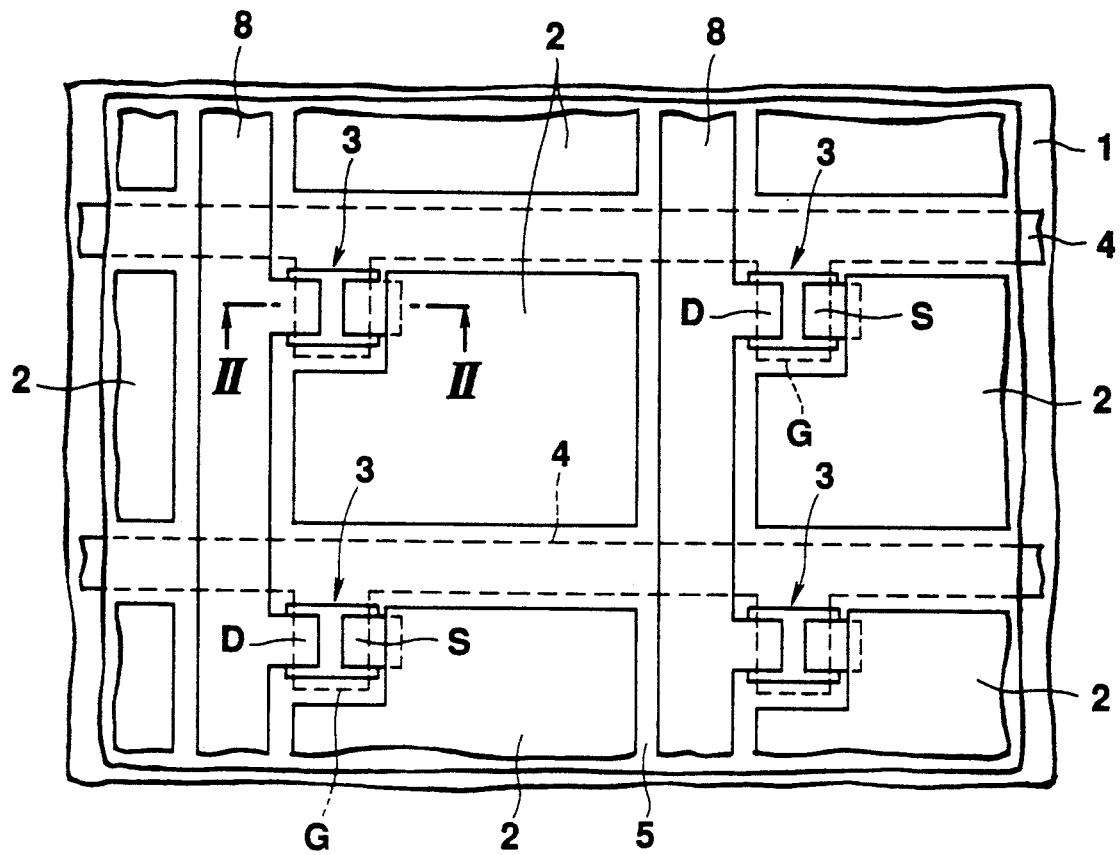
FIG.1 *(PRIOR ART)*
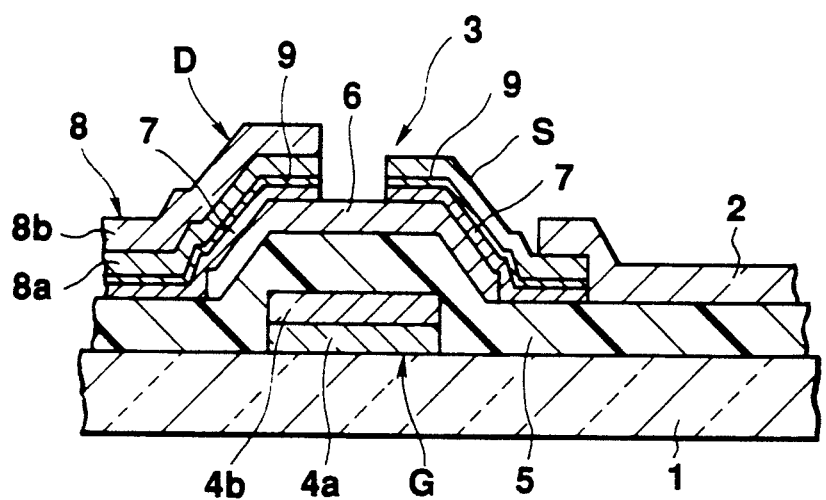
FIG.2 *(PRIOR ART)*

PANEL HAVING THIN FILM ELEMENT FORMED THEREON

BACKGROUND OF THE INVENTION

1. Field of the Invention

This invention relates to a panel having an insulating substrate, thin film elements formed by stacking thin films on the substrate, and wires formed to supply signals to the thin film elements.

2. Description of the Related Art

A panel having an insulating substrate, thin film elements formed on the substrate, and wires formed to supply signals to the thin film elements is used for forming, for example, an active matrix liquid crystal display device, etc.

A conventional thin-film-element-formed panel, which is used for forming an active matrix liquid crystal display device having thin film transistors serving as active elements, has its part constructed as shown in FIG. 1.

This panel has, on its transparent insulating substrate 1 made of glass, a plurality of pixel electrodes 2, a plurality of thin film transistors 3 serving as active elements, scanning wires 4 for supplying scanning signals to the transistors 3, and data wires 8 for supplying data signals to the transistors.

As is shown in FIG. 2, each of the thin film transistors 3 is formed by stacking a gate electrode G, a gate electrode insulating film 5 made of SiN (silicon nitride), and an i-type semiconductor layer 6 made of a-Si (amorphous silicon), and further stacking a source electrode S and a drain electrode D on the layer 6 with an n-type semiconductor layers 7, made of a-Si, interposed therebetween.

The gate electrode G of the thin film transistor 3 is formed integral with the scanning wire 4, the drain electrode D is formed integral with the data wire 8, and the source electrode S is connected to the pixel electrode 2. The gate insulating film 5 is formed over the scanning wire 4, and substantially all over the substrate 1. The pixel electrode 2 and data wire 8 are formed on the gate insulating film 5.

The scanning wire 4 includes that portion of the thin film transistor 3 which serves as the gate electrode G, and is made of Cr (chrome), Ta (tantalum), or Ta-Mo (tantalum-molybdenum) alloy. The data wire 8, drain electrode D, and source electrode S are formed of a metal film of Al (aluminum). A contact metal film 9 made of Cr and being in good ohmic contact with the n-type semiconductor layer 7 is provided under the data wire 8, drain electrode D, and source electrode S.

The scanning wire 4 is formed by providing a metal film on the substrate 1 and then patterning the metal film using photolithography. If an exposure mask to be used for exposing a photoresist film formed on the metal film has a defect, the patterned scanning wire 4 may be broken.

This damage may occur irrespective of whether the photoresist is of a positive type or of a negative type. In the case of using a positive photoresist, if the exposure mask has a defect or broken portion, a resist mask obtained by exposing, developing, and patterning a photoresist film will have a broken portion at a location corresponding to that of the exposure mask.

On the other hand, in the case of using a negative photoresist, if dust or the like is attached to a portion of the exposure mask, the resist mask will have a broken portion at a location corresponding to that portion of the exposure mask. In this case, also when dust or the like is attached to a photoresist film formed on the substrate, the resist mask may be broken.

Where the resist mask is broken, that portion of the metal film which is located corresponding to the broken portion of the mask is etched, so that the scanning wire 4 formed by patterning the metal film is inevitably broken.

The same can be said of the data wire 8. Since the wire 8 and the contact metal film 9 located under the former are patterned by photolithography, the patterned data wire 8 and contact metal film 9 may be broken when the exposure mask has a defect.

So as not to cause such a broken portion, in the conventional panel, each of the scanning wire 4 and data wire 8 has a two-layered structure with two metal layers patterned in different processes.

More specifically, as is shown in FIGS. 2-4, the scanning wire 4 comprises a lower metal film 4a and an upper metal film 4b laminated thereon. First, a film is formed and patterned by photolithography using an exposure mask to provide the lower metal film 4a, and then another film is formed on the patterned film 4a and patterned by photolithography using another exposure mask to provide the upper film 4b.

In the scanning wire 4 constructed as above, even if a broken portion A exists in the lower metal film 4a due to a defective portion in the exposure mask, the film 4a can have conductivity via the upper metal film 4b, thereby preventing breakage in the wire.

So with the data wire 8. As is shown in FIG. 2, the wire 8 has a two-layered structure, i.e. consists of a lower metal film 8a and an upper metal film 8b laminated thereon. The films 8a and 8b are patterned by photolithography using different exposure masks in different processes. Thus, even if the lower metal film 8a is broken, the broken portion is covered by the upper metal film 8b, thereby preventing a breakage in the wire.

In the above example, descriptions are made as to a thin-film-element-formed panel to be used for forming an active matrix liquid crystal display device having a thin film transistor serving as an active element. However, the idea of forming a wire of a two-layered structure has been applied also to other types of thin-film-element-formed panels—one to be used for forming an active matrix liquid crystal display device having that thin diode or non-linear resistor element of an MIM (metal film-insulating film-metal film) structure which serves as an active element; another having an electronic circuit comprising thin film elements.

However, in the above-described conventional panel, breakage may be caused in the wire even if the wire has a two-layered structure. This is because a defect may exist in an exposure mask used for exposing a photoresist film when the upper metal film is patterned.

That is, as is described above, in the scanning wire 4 shown in FIGS. 3 and 4, the lower metal film 4a is formed and patterned, and then the upper metal film 4b is formed and patterned on the former. At this time, if there is a defective portion in the exposure mask used for exposing the photoresist film when the upper metal film 4b is patterned, a broken portion B will be caused in that portion of the upper film 4b which corresponds to the defective portion. This broken portion will cause etching of a corresponding portion of the lower metal film 4a. That is, the wire will be broken at B.

SUMMARY OF THE INVENTION

It is the object of the invention to provide a panel having thin film elements formed thereon and wires formed substantially free of breakage which is liable to occur at the time of patterning them.

In the invention, an insulating or etching stopper film is formed between the lower and upper metal films of a wire. The insulating film formed of an oxide layer may preferably serves as etching stopper layer at the time of patterning the lower metal film. Since the oxide layer has high etching-resistance, even if breakage occurs in the upper metal film when the upper film formed on the lower film is patterned by etching, that portion of the lower film which is located on the oxide layer is prevented from being etched.

This advantage can be obtained wherever breakage occurs in the upper film. This is because the oxide layer extends over the entire length thereof, and at least part of the lower film remains under a broken portion of the upper film.

Further, though the oxide layer is an electrical insulation layer, it is formed only part of the surface of the lower film, and hence the lower film has conductivity. Also, since each of the upper and lower films has a width larger than the oxide layer, those portions of the films which do not contact the oxide layer are electrically connected to each other.

Accordingly, when breakage occurs in the lower film of the wire, the wire obtains conductivity via the upper metal film. Similarly, when breakage occurs in the upper film, it obtains conductivity via the lower film. In summary, the wire is almost completely prevented from being broken.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view, showing part of a conventional thin-film-element-formed panel;

FIG. 2 is an enlarged sectional view taken along line II—II in FIG. 1;

DETAILED DESCRIPTION OF THE PREFERRED EMBODIMENTS

The embodiment of the invention will be explained with reference to FIGS. 5–17.

Figure 3:
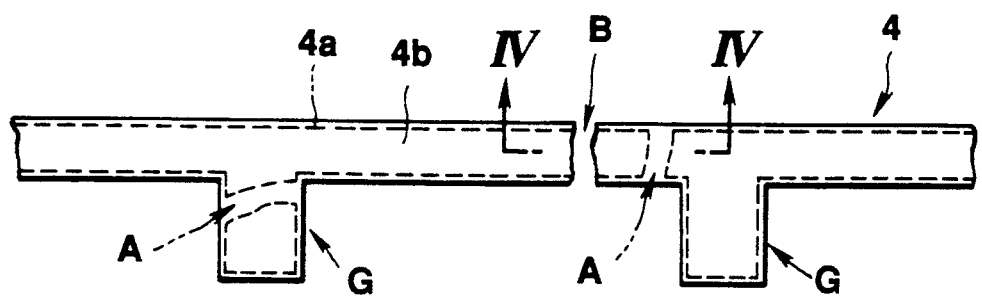
FIG. 3 is a plan view, showing part of a scanning wire employed in a conventional thin-film-element-formed panel.
Figure 4:
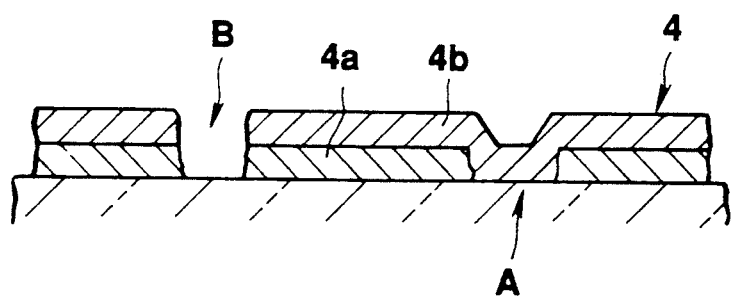
FIG. 4 is an enlarged sectional view taken along line IV—IV in FIG. 3.
Figure 5:
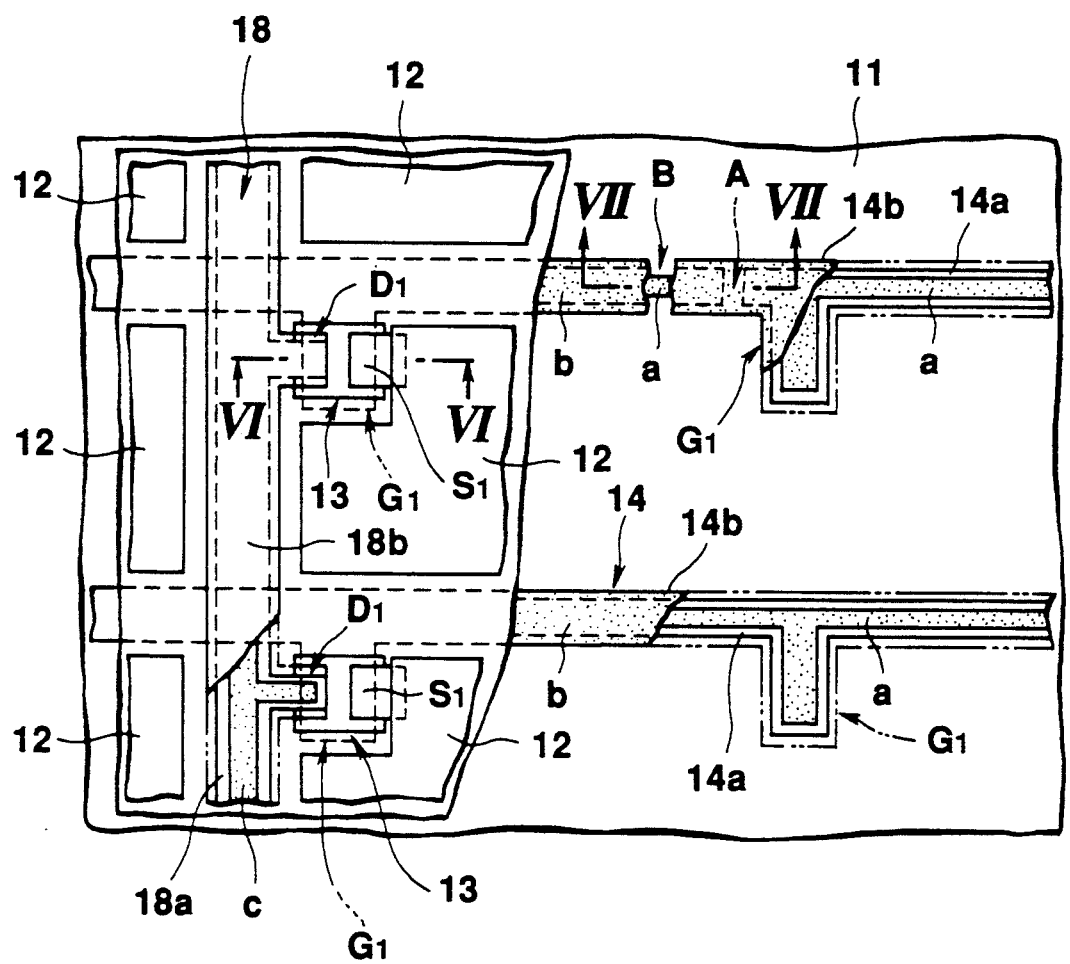
FIG. 5 is a plan view, showing part of a thin-film-element-formed panel according to an embodiment of the invention.

FIG. 5 is a plan view, showing part of a thin-film-element-formed panel according to the invention. This panel is used for forming an active matrix liquid crystal display device having thin film transistors serving as active elements.

The panel has, on its transparent insulating substrate 11 made of glass or ceramics, a plurality of pixel electrodes 12, a plurality of thin film transistors 13 serving as active elements, scanning wires 14 for supplying scanning signals to the transistors 13, and data wires 18 for supplying data signals to the transistors.

Figure 6:
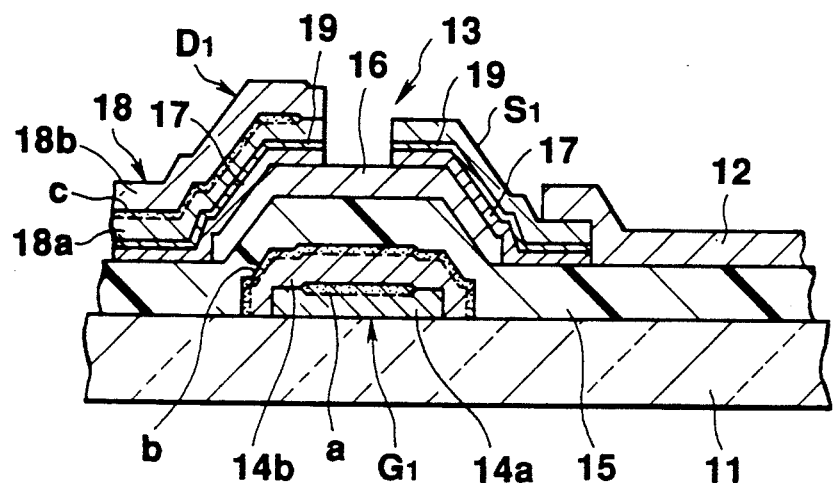
FIG. 6 is an enlarged sectional view taken along line VI—VI in FIG. 5.

As is shown in FIG. 6, each of the thin film transistors 13 is formed by stacking a gate electrode G1, a gate electrode insulating film 15 made of SiN, and an i-type semiconductor layer 16 made of a-Si, and further stacking a source electrode S1 and a drain electrode D1 on the layer 16 with n-type semiconductor layers 17, made of a-Si, interposed therebetween.

The gate electrode G1 of the transistor 13 is formed integral with the scanning wire 14, the drain electrode D1 is formed integral with the data wire 18, and the source electrode S1 is connected to the pixel electrode 12. The gate insulating film 15 is formed over the scanning wire 14, and substantially all over the substrate 11. The pixel electrode 12 and data wire 18 are formed on the gate insulating film 15. A contact metal film 19 made of Cr and being in a good ohmic contact with the n-type semiconductor layer 17 is provided under the data wire 18, drain electrode D1, and source electrode S1.

Figure 7:
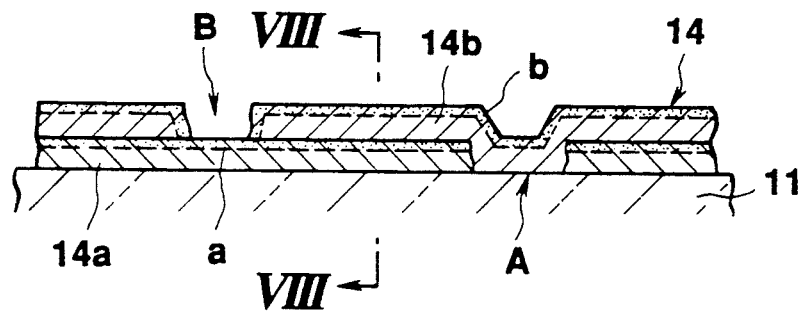
FIG. 7 is an enlarged sectional view taken along line VII—VII in FIG. 5.
Figure 8:
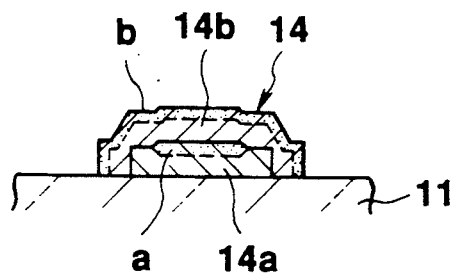
FIG. 8 is an enlarged sectional view taken along line VIII—VIII in FIG. 7.

As is shown in FIGS. 6–8, the scanning wire 14 is formed integral with that portion of the thin film transistor 13 which serves as the gate electrode G1, and comprises a lower metal film 14a and an upper metal film 14b laminated thereon. The films 14a and 14b are made of Al, or of Ti-containing-Al which contains a small amount of Ti (titanium) which is (a cheap metal having low resistance).

The entire upper surface of the lower metal film 14a is coated with an oxide or insulating layer a having a width of ⅓–⅔ of that of the metal film 14a. The oxide layer a is formed by subjecting the surface of the film 14a to anodic oxidation, and extends in width-directional middle portions of the wire portion and electrode G1 portion of the film 14a.

The upper metal film 14b has a width larger than the oxide layer a of the lower metal film 14a, and is electrically connected, all over the entire length, to those portions of the film 14a which are not coated with the oxide layer a.

That is, though the oxide layer a is an electrically insulating layer, that side of the lower metal film 14a which is opposite to the side on which the oxide layer a is formed has conductivity. Further, since the width of the oxide layer a is smaller than those of the lower and upper metal films 14a and 14b, the films 14a and 14b can be electrically connected to each other on the outside of the oxide layer a.

To get a large conductive area between the films 14a and 14b, the upper metal film 14b has a width larger than the lower metal film 14a to cover the entire surface of it and contact the opposite lateral surfaces of it.

An oxide layer b is formed over the upper surface of the upper metal film 14b by subjecting the upper surface to anodic oxidation, in order to protect the upper surface of the scanning wire 14 at the time of forming the gate insulating film 15 after the forming of the wire 14.

Specifically, the gate insulating film (SiN film) 15 is formed at a temperature of 200° C. or more by the plasma CVD method. Where the scanning wire 14 is made of Al, if the Al film is heated at a high temperature, its surface may become rough, and sharp projections called hillocks may appear thereon. Accordingly, it is possible that hillocks are caused on the scanning wire 14 made of Al when the gate insulating film 15 is formed, and break through the film 15 to destroy it.

To avoid this, the entire surface of the scanning wire 14 (i.e., the entire surface of the upper metal film 14b) is subjected to anodic oxidation in the embodiment. By virtue of the oxide layer b, the hardness of the surface of the scanning wire 14 is increased, which prevents hillocks from being caused on the surface thereof at the time of forming the insulting film 15. Thus, the gate insulating film 15 is not destroyed in the embodiment irrespective of the scanning wire 14 being made of Al.

The scanning wire 14 is heated also at the time of forming the i-type semiconductor layer 16, n-type semiconductor layer 17, contact metal film 19, data wire 18, and metal films serving as the drain and source electrodes D1 and S1. However, these films and layers are formed at temperatures identical to or higher than the film-forming temperature of the gate insulating film 15. Accordingly, it suffices if the thickness of the oxide layer b is controlled to such a value as can prevent its surface from getting rough even when the layer b is heated to the film-forming temperature of the gate insulating film 15.

If the scanning wire 14 is made of Ti-containing-Al, the surface of the wire film can substantially be prevented from becoming rough at the time of heating, as compared with the case of using the above scanning wire 14 made of Al. Also in this case, the film 15 can more reliably be protected by forming the oxide layer b on the scanning wire 14.

Moreover, the oxide layer b formed on the wire 14 and the gate insulating film 15 cooperate to form a two-layered insulation structure between the gate electrode G1 of the thin film transistor 13 and i-type semiconductor layer 16, thereby enhancing the insulation breakdown voltage. Thus, short circuit between the gate electrode G1 and drain electrode D1 or source electrode S1 can securely be prevented, thereby enhancing the reliability of the transistor 13.

The data wire 18 is formed integral with that portion of the thin film transistor 13 which serves as the drain electrode D1, and comprises a lower metal film 18a and an upper metal film 18b laminated thereon. The films 18a and 18b are made of Al or of Ti-containing-Al.

Also in the data wire 18, the entire upper surface of the lower metal film 18a is coated with an oxide layer c having a width of ⅓-⅔ of that of the metal film 18a. The oxide layer c extends in width-directional middle portions of the wire portion and drain electrode D1 portion of the film 18a.

The upper metal film 18b has a width larger than the oxide layer c of the lower metal film 18a, and is electrically connected, all over the entire length, to those portions of the film 18a which are not coated with the oxide layer c. As in the case of the upper metal film 14b of the scanning wire 14, the upper metal film 18b of the data wire 18 has a width larger than the lower metal film 18a to cover the entire surface of it and contact the opposite lateral surfaces of it.

The source electrode S1 of the thin film transistor 13 consists of a single conductive film. Like the lower metal film 18a of the data wire 18, the conductive film is made of Al or Ti-containing-Al.

No oxide films are formed on the data wire 18 (the upper metal film 18b) and the source electrode S1. This is because what is provided on them is an orientation film (not shown) formed at a temperature at which the surface of an Al or Ti-containing-Al film will not get rough. However, in a case where a protective insulating film made of SiN or so is formed on the thin film transistor 13, data wire 18, and pixel electrode 12, and then an orientation film is formed on the protective film, it is desirable to oxidize the surfaces of the data wire 18 and source electrode S1 to protect them from getting rough at the time of forming the orientation film.

The scanning wire 14 and data wire 18 are formed by the following process. The scanning wire 14 and data wire 18 are formed in the same process. Therefore, this process will be explained referring to the scanning wire 14 only. FIGS. 9A-9F are cross sectional views of the gate electrode G1 portion of the scanning wire 14, useful in explaining the process of forming the wire 14.

Figure 9A:
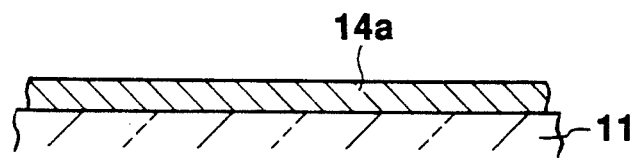
FIGS. 9A–9F are views, showing steps for manufacturing a scanning wire shown in FIG. 5.
Figure 9B:
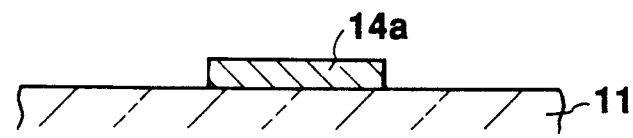
Figure 10:
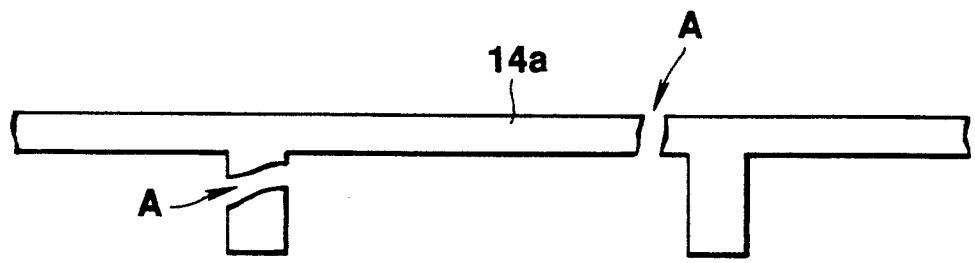
FIG. 10 is a plan view of a structure shown in FIG. 9B.

The lower metal film (Al or Ti-containing-Al film) 14a of the scanning wire 14 is formed on the substrate 11 by sputtering or the like, as is shown in FIG. 9A, and then the film 14a is patterned by photolithography, to form the scanning wire 14 and gate electrode G1 as shown in FIGS. 9B and 10.

At this time, if the exposure mask used to expose a photoresist film applied to the lower metal film 14a has defective portions, the resist mask (not shown) patterned by exposing and developing the photoresist film will have broken portions at locations corresponding to the defective portions of the exposure mask. Thus, those portions of the lower metal film 14a which are located corresponding to the defective portions will be etched, thereby causing broken portions A in the patterned film 14a as shown in FIG. 10. Though FIG. 10 shows the state in which the broken portions A are caused in the wire portion and gate electrode G1 portion of the lower metal film 14a, various portions of the film 14a can be broken depending upon the state of the exposure mask.

Figure 9C:
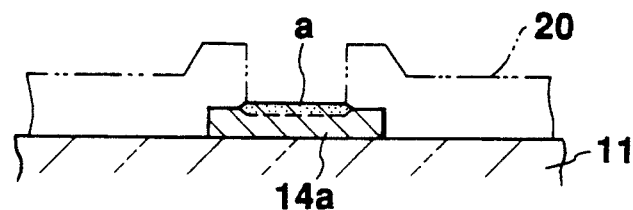
Figure 11:
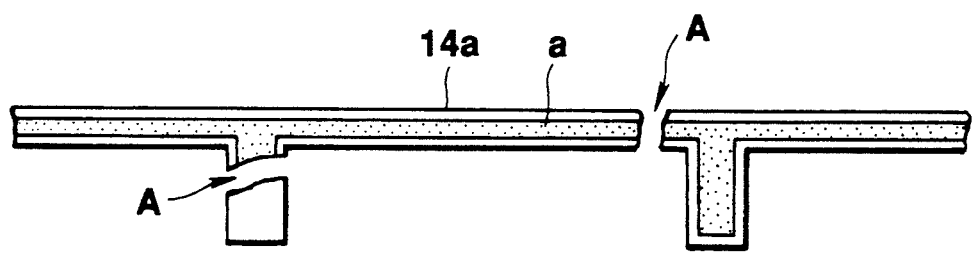
FIG. 11 is a plan view of a structure shown in FIG. 9C.

Then, as is shown in FIGS. 9C and 11, a resist mask 20, covering the lower metal film 14a except the width-directional middle portions of the wire and gate electrode portions of the film 14a, is formed, and then the film 14a is subjected to anodic oxidation, thereby forming the oxide or insulating layer a which extends all over the width-directional middle portions of the wire and gate electrode G1 portions of the film 14a.

Anodic oxidation of the lower metal film 14a is performed by connecting the both opposite ends of the film 14a to the anode electrode of a DC power source using a cable with a clip, then soaking the substrate 11 in electrolyte with the film 14a opposed to the cathode electrode (platinum electrode), and then applying voltage between the film 14a and cathode electrode.

When voltage is applied between the film 14a and cathode electrode in electrolyte, chemical reaction occurs in those portions of the film 14a serving as the anode electrode which are not covered with the resist mask 20, thereby oxidizing the portions from the surfaces thereof. The depth of an oxidized portion is determined in accordance with the applied voltage, and hence the thickness of the oxide layer a can be controlled to a desired value by controlling the value of the applied voltage. Further, the volume of the oxide layer a becomes greater than that of the metal film, so that the surface of the oxide layer slightly projects from that of the metal film 14a, as is shown in FIG. 9C.

If the exposure mask used to pattern the resist mask 20 on the substrate 11 at the time of the anodic oxidation has defective portions, the resist mask will have broken portions at locations corresponding to the defective portions of the exposure mask. Accordingly, these broken portions will be oxidized.

However, even if those surface portions of the lower metal film 14a which extend over the entire width are oxidized, sufficient conductivity can be obtained between the lower metal film 14a and the upper metal film 14b formed later since such entire-width oxidation occurs in only those portions of the film 14a which correspond to the defective portions of the exposure mask.

Figure 9D:
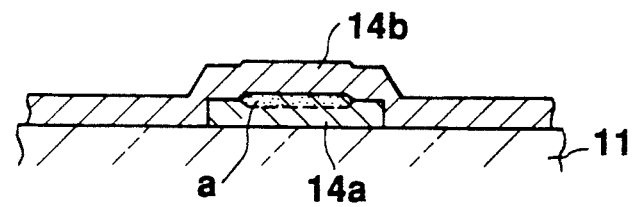
Figure 9E:
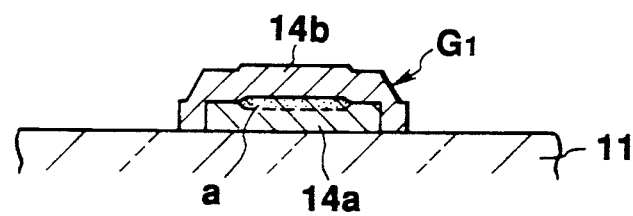

After the forming of the oxide layer a, the upper metal film (Al or Ti-containing-Al film) 14b is formed on the substrate 11 by sputtering, as is shown in FIG. 9D, followed by patterning the film 14b by photolithography to form the scanning wire 14, as is shown FIGS. 9E, and 12-14.

Figure 12:
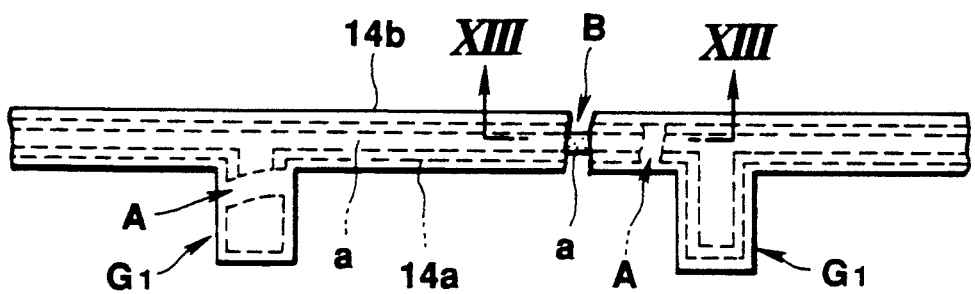
FIG. 12 is a plan view of a structure shown in FIG. 9E.

Also at this time, if the exposure mask used to expose a photoresist film applied to the upper metal film 14b has a defective portion, the resist mask (not shown) patterned by exposing and developing the photoresist film will have a broken portion at a location corresponding to the defective portion of the exposure mask. Thus, that portion of the upper metal film 14b which is located corresponding to the defective portion will be etched, thereby causing a broken portion B in the patterned film 14b as shown in FIG. 12. Though FIG. 12 shows the state in which the broken portion B is caused in the wire portion of the upper metal film 14b, various portions of the film 14b can be broken depending upon the state of the exposure mask.

Figure 13:
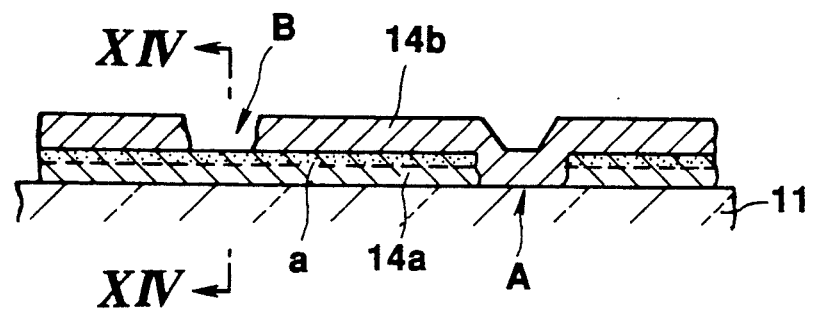
FIG. 13 is an enlarged sectional view taken along line XIII—XIII in FIG. 12.
Figure 14:
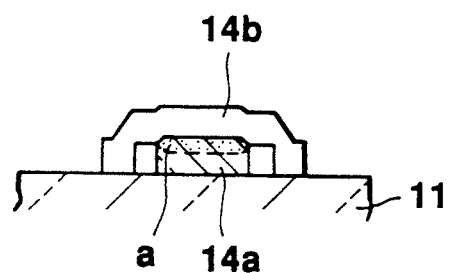
FIG. 14 is an enlarged sectional view taken along line XIV—XIV in FIG. 13.

When the broken portion B is caused in the upper metal film 14b, that portion of the lower metal film 14a which is located under the portion B will be etched together with a corresponding portion of the upper lower metal film 14b, if the oxide layer a having a high etching-resistance is not interposed therebetween. Actually, however, the oxide layer a extends on the width-directional middle portion of the lower film 14a, and serves as etching-stopper layer. Therefore, even if that portion of the lower metal film 14a which is not protected by the oxide layer a is etched, conductivity will be obtained via the other portion remaining without being etched by virtue of the oxide layer, as is shown in FIGS. 12-14. Further, since the oxide layer extends over the entire length of the lower metal film 14a, the lower metal film 14a remains under any broken portion of the upper metal film 14b.

In addition, it is possible that the portion of the upper metal film 14b which is located directly above a broken portion of the lower film 14a is broken, thereby losing conductivity. However, it is very rare that the exposure mask used for patterning the lower metal film 14a has a defective portion at the same location as that of a defective portion of the exposure mask used for patterning the upper metal film 14b. Accordingly, the above-described possibility can be ignored.

Figure 9F:
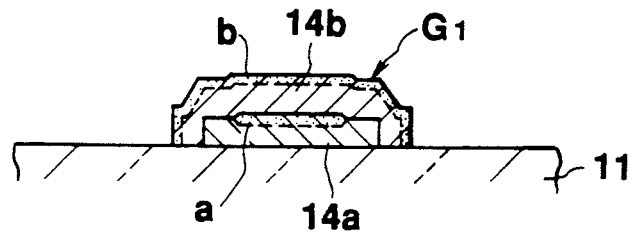

Thereafter, as is shown in FIG. 9F, the surface of the upper film 14b is subjected to anodic oxidation, thereby forming the oxide layer b over the entire surface thereof. Thus, the scanning wire 14 shown in FIGS. 7 and 8 is completed. Anodic oxidation of the upper film 14b is performed in the same manner as that of the lower film 14a (however, no resist masks are necessary).

Though the data wire 18 is formed in substantially the same manner as that of the scanning wire 14, anodic oxidation of the surface of the wire 18 (i.e., the upper metal film 18b) is not necessarily performed.

As is described above, in the thin-film-element-formed panel according to the invention, the surfaces of the lower metal films 14a and 18a of the scanning wire 14 and data wire 18 are oxidized to form oxide layers a and b serving as etching stopper layers. By virtue of these oxide layers, even if the upper films 14b and 18b are broken at the time of forming them on the lower films 14a and 18a, those portion of the lower films 14a and 18a which are located under the oxide layers a and c can be prevented from being etched.

Though the oxide layers a and c are electrical insulation layers, they are formed only in the upper surfaces portions of the lower metal films 14a and 18a. Accordingly, the other portions or portions under the upper surface of the films 14a and 18a have conductivity. Further, the widths of the oxide layers a and c are smaller than those of the lower films 14a and 18a, respectively, and also smaller than those of the upper films 14b and 18b, respectively. Thus, those portions of the lower films 14a and 18a which are not located on the oxide layers a and c can be electrically connected to corresponding portions of the upper films 14b and 18b, respectively.

Therefore, as can be understood from FIGS. 7 and 13, even if the broken portions A are caused in the lower metal films 14a and 18a, these films can have electrical conductivity via those portions of the upper metal films 14b and 18b which are not formed on the oxide layers and connected to the lower films 14a and 18a, respectively. Similarly, even if the broken portions B are caused in the upper metal films 14b and 18b, the films 14b and 18b can have electrical conductivity via the lower metal films 14a and 18a. Thus, breakage can be prevented almost completely in the scanning and data wires 14 and 18.

The same effect can be obtained in a case where a resist mask used for patterning the lower and upper metal films 14a, 18a, 14b, and 18b is made of a positive-type photoresist, and in a case where it is made of a negative-type photoresist.

Specifically, in the case of using the positive-type photoresist, the resist mask will have a broken portion when the exposure mask has a broken portion. On the other hand, in the case of using the negative-type photoresist, the resist mask will have a broken portion when the exposure mask has a defective portion to which a foreign material such as "dust" is attached, or when such a foreign material is attached to the photoresist film applied onto the substrate.

This being so, the broken portions A and B are caused in the lower and upper metal films 14a, 18a, 14b, and 18b. However, irrespective of the broken portions A, the lower metal films 14a and 18a can have electrical conductivity via the upper metal films 14b and 18b, while the upper metal films 14b and 18b can have electrical conductivity via the lower metal films 14a and 18a, irrespective of the broken portions B. Accordingly, breakage of the scanning and data wires 14 and 18 is prevented.

Figure 15:
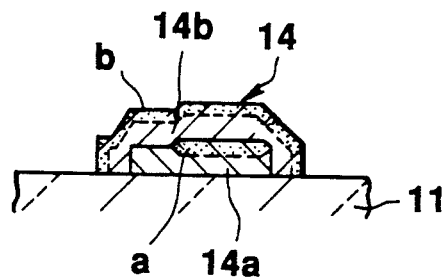
FIG. 15 is an enlarged sectional view, showing another stacking structure of the scanning wire of the invention.
Figure 16:
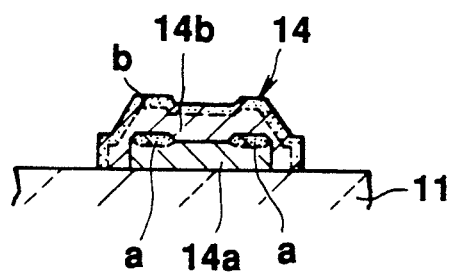
FIG. 16 is an enlarged sectional view, showing a further stacking structure of the scanning wire of the invention.

Though in the above-described embodiment, the oxide layer a (c) extends on the width-directional middle portion of the lower metal film 14a (18a), it may be formed on one side of the film 14a (18a) as shown in FIG. 15, or may comprises two layer portions extending on both opposite side portions of the film 14a (18a) with a conductive portion interposed therebetween, as shown in FIG. 16.

Figure 17:
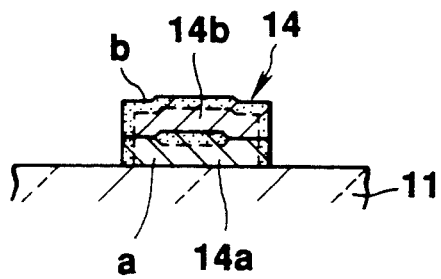
FIG. 17 is an enlarged sectional view, showing a further stacking structure of the scanning wire of the invention.

In addition, in the embodiment, an etching stopper layer comprising an oxide insulating film, which has a width smaller than the lower metal film 14a (18a), is formed thereon, and the upper metal film 14b (18b) having a width larger than the lower film 14a (18a) is formed thereon with the stopper layer interposed therebetween. The lower and upper films may have substantially the same width as shown in FIG. 17.

Though in the embodiment, the oxide insulating layer b is formed on the scanning wire 14, it can be omitted if the scanning wire 14 is made of Ti-containing-Al containing more Ti than in the embodiment, since in this case the scanning wire 14 can be almost completely prevented from getting rough at the time of forming the gate insulating film 15.

Moreover, though the lower and upper metal films 14a, 18a, 14b, and 18b are made of the same metal (Al or Ti-containing-Al), the invention is not limited to this, but may be modified such that the lower metal films 14a and 18a are made of Ti-containing-Al, which can be brought into good contact with the substrate 11 made of glass, and the upper metal films 14b and 18b are made of Al. Further, the lower and upper metal films may be made of another conductive metal, such as Cr, Ta, a Ta-Mo alloy, Au, or Ag. The etching stopper film is not limited to the oxide Al film, but may be made of e.g. an oxide Cr film.

Furthermore, though the above-described thin-film-element-formed panel is used for forming an active matrix liquid crystal display device having thin film transistors serving as active elements, it is applicable to an active matrix liquid crystal display device having non-linear resistance elements, each comprising a thin film diode or having an MIM (metal film-insulating film-metal film) structure and serving as active element. It is also applicable to a circuit panel provided with an electronic circuit formed of thin film elements.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A panel having thin film elements formed thereon comprising:

an insulating substrate;

a plurality of thin film elements formed on the substrate, each including a plurality of thin films laminated on one another to have a predetermined form; and wires connected to at least one of the thin film elements, for supplying a signal thereto, each of the wires having a lower conductive film formed above the insulating substrate, an upper conductive film formed on the lower conductive film to be electrically connected thereto, and an etching stopper film interposed between the lower and upper conductive films, wherein the etching stopper film has a width smaller than the lower conductive film and extends substantially over the entire length thereof, and is an insulating oxide film formed by oxidizing a surface of the lower conductive film, and the upper conductive film has a width larger than the etching stopper film.

2. The panel according to claim 1, wherein the lower and upper conductive films are metal films.

3. The panel according to claim 1, wherein the lower conductive film is made of a metal which is oxidized by anodic oxidation, and the insulating oxide film is a metal oxide film obtained by subjecting the lower conductive film to anodic oxidation.

4. The panel according to claim 1, wherein each of the thin film elements includes a three terminal thin film element including a source electrode, a drain electrode, a gate electrode, a gate insulating film and a semiconductor film, the source and drain electrode positioned on the semiconductor film, spaced by a predetermined distance from each other to form a channel portion there between, the gate electrode being formed at a location corresponding to the channel portion, the gate insulating film interposed therebetween.

5. The panel according to claim 4, wherein the gate electrode is connected to one of the wires.

6. The panel according to claim 4, wherein the gate electrode is formed on the insulating substrate, the gate insulating film covers the gate electrode, and the semiconductor film is formed on the gate insulating film and facing the gate electrode.

7. The panel according to claim 4, wherein the gate electrode comprises a lower conductive film formed on the insulating substrate, an etching stopper film formed on part of the lower conductive film, and an upper conductive film formed on the etching stopper film and electrically connected to the lower conductive film, the gate electrode being formed integral with one of the wires.

8. A thin-film-transistor panel comprising:

an insulating substrate;

a plurality of lower conductive films formed on the substrate and extending in a longitudinal or lateral direction, each of the lower conductive films having a plurality of projections formed at regular intervals and corresponding to a plurality of gate electrodes;

a plurality of oxide insulating films formed by oxidizing at least part of surfaces of the lower conductive films;

a plurality of upper conductive films each covering a corresponding one of the oxide insulating films and a corresponding one of the lower conductive films, and having a shape corresponding to that of the lower conductive film, each of the upper conductive films cooperating with corresponding one of the lower conductive films to form a gate electrode and a scanning wire;

a gate insulating film covering substantially the entire surface of the insulating substrate provided with the lower and upper conductive films;

a plurality of semiconductor films formed at locations corresponding to the gate electrode portions of the lower and upper conductive films;

a plurality of source electrodes and a plurality of drain electrodes, each pair of the source and drain electrodes being formed in corresponding one of the semiconductor films, spaced by a predetermined distance from each other so as to form a channel portion in the semiconductor film, thereby being electrically connected thereto;

a plurality of data wires each connecting, to one another, one of a group of the source electrodes and a group of the drain electrodes, in the lateral direction or longitudinal direction; and a plurality of transparent electrodes each connected to corresponding one contained in the other of the groups.

9. The thin-film-transistor panel according to claim 8, wherein one of the source and drain electrodes has another upper conductive film laminated on another lower conductive film with another insulating film interposed therebetween, and electrically connected thereto, and is formed integral with corresponding one of the data wires.

10. The thin-film-transistor panel according to claim 8, wherein each of the lower conductive films is made of a metal which can be oxidized by anodic oxidation, and each of the insulating film is a metal oxide film obtained by subjecting corresponding one of the lower conductive film to anodic oxidation.

11. The thin-film-transistor panel according to claim 8, wherein each of the upper conductive films has a width larger than corresponding one of the insulating films which is formed between corresponding upper and lower conductive films.

12. The thin-film-transistor panel according to claim 8, wherein each of the insulating films which is formed between corresponding upper and lower conductive films has a width smaller than the lower conductive film and extends substantially over the entire length thereof, and the upper conductive film has a width larger than the insulating film.

13. A thin film device comprising:
a plurality of thin film elements, each including a plurality of thin films laminated on one another to have a predetermined form; and
wires, connected to at least one of the thin film elements, for supplying signals thereto, at least one of the wires having a lower conductive film, an upper conductive film formed on the lower conductive film electrically connected thereto, and an etching stopper film interposed between the lower and upper conductive films, wherein the etching stopper film is an insulating film formed by processing the lower conductive film,
wherein the etching stopper film is formed by oxidizing a surface of the lower conductive film.

14. The device according to claim 13, wherein the lower conductive film is made of a metal, and the insulating film is a metal oxide film obtained by subjecting the lower conductive film to anodic oxidation.

15. The device according to claim 13, wherein the etching stopper film has a width smaller than the lower conductive film, and the upper conductive film has a width larger than the etching stopper film.

16. A thin-film-transistor panel comprising:
an insulating substrate;
a plurality of lower conductive films formed on the substrate, each of the lower conductive films having a plurality of projections corresponding to a plurality of gate electrodes;
a plurality of insulating films formed by processing at least part of surfaces of the lower conductive films;
a plurality of upper conductive films each covering a corresponding one of the insulting films and a corresponding one of the lower conductive films, and each of the upper conductive films cooperating with a corresponding one of the lower conductive films to form a gate electrode and a scanning wire from among said plurality of gate electrodes;
a gate insulating film covering at least locations corresponding to gate electrode portions of the lower and upper conductive films;
a plurality of semiconductor films formed at locations corresponding to the gate electrode portions of the lower and upper conductive films;
a plurality of source electrodes and a plurality of drain electrodes, each pair of the source and drain electrodes being formed on a corresponding one of the semiconductor films, spaced by a predetermined distance from each other;
a plurality of data wires each connecting one of a group of the source electrodes and a group of the drain electrodes; and
a plurality of electrodes each connected to a corresponding one contained in the other of the groups.

17. The panel according to claim 16, wherein the insulating films include oxide insulating films formed by oxidizing at least part of the surfaces of the lower conductive films.

18. A semiconductor device comprising:
a semiconductor element including a plurality of thin films laminated on one another to have a predetermined form; and
a wire, connected to the semiconductor element, for supplying a signal thereto, the wire having a lower conductive film, an upper conductive film formed on the lower conductive film electrically connected thereto, and an etching stopper film interposed between the lower and upper conductive films,
wherein the etching stopper film is an insulating film formed by processing a surface region of the lower conductive film,
wherein the etching stopper film is formed by oxidizing the surface region of the lower conductive film.

19. The device according to claim 18, wherein the lower conductive film is made of a metal, and the insulating film is a metal oxide film obtained by subjecting the lower conductive film to anodic oxidation.

20. The device according to claim 18, wherein the etching stopper film has a width smaller than the lower conductive film, and the upper conductive film has a width larger than the etching stopper film.

* * * * *